United States Patent
Zhou et al.

(10) Patent No.: US 8,519,496 B2
(45) Date of Patent: Aug. 27, 2013

(54) SPIN-TRANSFER TORQUE MAGNETIC RANDOM ACCESS MEMORY WITH MULTI-LAYERED STORAGE LAYER

(75) Inventors: Yuchen Zhou, San Jose, CA (US); Yiming Huai, Pleasanton, CA (US); Rajiv Yadav Ranjan, San Jose, CA (US); Roger Klas Malmhall, San Jose, CA (US)

(73) Assignee: Avalanche Technology, Inc., Fremont, CA (US)

(*) Notice: Subject to any disclaimer, the term of this patent is extended or adjusted under 35 U.S.C. 154(b) by 265 days.

(21) Appl. No.: 13/035,857

(22) Filed: Feb. 25, 2011

(65) Prior Publication Data

US 2012/0087185 A1    Apr. 12, 2012

Related U.S. Application Data

(60) Provisional application No. 61/391,263, filed on Oct. 8, 2010.

(51) Int. Cl.
*H01L 29/82*     (2006.01)

(52) U.S. Cl.
USPC ............ 257/421; 257/E21.323; 365/171

(58) Field of Classification Search
USPC ............ 257/421, E21.323; 365/171
See application file for complete search history.

(56) References Cited

U.S. PATENT DOCUMENTS

2011/0007560 A1*    1/2011   Dieny et al. ............... 365/171

* cited by examiner

*Primary Examiner* — Thanh V Pham
(74) *Attorney, Agent, or Firm* — Maryam Imam; IPxLAW Group LLP

(57) ABSTRACT

A spin-transfer torque magnetic random access memory (STTMRAM) element is configured to store a state when electrical current is applied thereto. The STTMRAM element includes first and second free layers, each of which having an associated direction of magnetization defining the state of the STTMRAM element. Prior to the application of electrical current to the STTMRAM element, the direction of the magnetization of the first and second free layers each is in-plane and after the application of electrical current to the STTM-RAM element, the direction of magnetization of the second free layer becomes substantially titled out-of-plane and the direction of magnetization of the first free layer switches. Upon electrical current being discontinued, the direction of magnetization of the second free layer remains in a direction that is substantially opposite to that of the first free layer.

27 Claims, 10 Drawing Sheets

SPIN-TRANSFER TORQUE MAGNETIC RANDOM ACCESS MEMORY WITH MULTI-LAYERED STORAGE LAYER

CROSS-REFERENCE TO RELATED APPLICATIONS

This application claims priority from previously-filed U.S. Provisional Application No. 61/391,263, filed on Oct. 8, 2010, by Huai et al. and entitled "Magnetic Latch Magnetic Random Access Memory (MRAM)".

BACKGROUND OF THE INVENTION

1. Field of the Invention

The present invention relates to a spin-transfer torque (STT) magnetic random access memory (MRAM), and, more particularly, to an STTMRAM element having magnetic tunnel junctions (MTJs) with a multi-layered free layer.

2. Description of the Prior Art

Magnetic random access memory (MRAM) is a type of non-volatile memory in which magnetization of magnetic layers in MTJs switches between parallel (corresponding to a low resistance state) and anti-parallel (corresponding to high resistance state) configurations. One type of MRAM is spin-transfer torque magnetic random access memory (STTM-RAM) where switching occurs through the application of spin polarized current across the MTJ during programming.

STTMRAM has significant advantages over magnetic-field-switched (toggle) MRAM, which has been recently commercialized. The main hurdles associated with field-switched-MRAM are its more complex cell architecture with high write current (currently in the order of milliamps (mA)) and poor scalability attributed to the process used to manufacture these devices. That is, these devices cannot scale beyond 65 nanometer (nm) process node. The poor scalability of such devices is intrinsic to the field writing methods. The current generated fields to write the bits increase rapidly as the size of the MTJ elements shrink. STT writing technology allows directly passing a current through the MTJ, thereby overcoming the foregoing hurdles and resulting in much lower switching current [in the order of microamps (uA)], simpler cell architecture which results in a smaller cell size (for single-bit cells) and reduced manufacturing cost, and more importantly, improved scalability.

FIG. 1 shows a prior art STTMRAM element 10 having an anti-ferromagnetic (AFM) layer 6 on top of which is shown formed the a pinned layer (PL) (also known as a "fixed layer") 5 on top of which is shown formed an exchange coupling layer 4 on top of which is shown formed a reference layer (RL) 3 on top of which is shown formed a barrier layer (BL, also known as a "tunnel layer" or a "MTJ junction layer") 2 on top of which is shown formed a free layer (FL) (also known as a "storage layer (SL)") 1. The layers 3-5 are typically referred to as "synthetic antiferromagnetic" (SAF) structure and generally used for providing reference to the free layer 1 during spin torque (ST) switching of the FL 1 and reading of the state of the FL 1 through the resistance down and across the element 10. The exchange coupling layer (ECL) 4 is typically made of ruthenium (Ru).

When electrons flow across the element 10, perpendicular to the film plane from the RL 3 to the FL 1, ST from electrons transmitted from the RL 3 to the FL 1 can orientate storage layer or free layer magnetization (as shown by the direction of the arrows in FIG. 1) to a direction parallel to that of RL 3. When electrons flow from the FL 1 to the RL 3, ST from electrons reflected from the RL 3 back into the FL 1 can orientate SL magnetization in a direction that is anti-parallel relative to that of RL 3. With controlling electron (current) flow direction, SL magnetization direction can be switched. Resistance across the element 10 changes between low and high resistance states when the magnetization of the FL 1 is parallel or anti-parallel relative to that of RL 3. However, the problem with the element 10 as well as other prior art STT-MRAM elements is that the level of electric current required to switch the magnetization orientation of FL 1 between parallel and anti-parallel relative to that of RL 3 is still higher than a typical semiconductor CMOS structure can provide, therefore making prior art STTMRAMs' applicability to storage systems not practical..

What is needed is a STTMRAM element that can switch at lower current while still maintaining the same level of stability against thermal agitation.

SUMMARY OF THE INVENTION

Briefly, a spin-transfer torque magnetic random access memory (STTMRAM) element is configured to store a state when electrical current is applied thereto. The STTMRAM element includes a fixed layer with a magnetization pinned in the plane of the fixed layer and a barrier layer formed on top of the fixed layer. The STTMRAM element further includes a junction layer (JL), and a magnetization layer disposed between the barrier layer and the JL. The magnetization layer is made of a first free layer and a second free layer, separated by a non-magnetic separation layer (NMSL), with the first and second free layers each having in-plane magnetizations that act on each other through anti-parallel coupling. Further included in the STTMRAM element is a perpendicular reference layer (PRL) formed on top of the JL with magnetization in a direction perpendicular to the magnetization of the fixed layer. The direction of the magnetization of the first and second free layers each is in-plane prior to the application of electrical current to the STTMRAM element and after the application of electrical current to the STTMRAM element, the direction of magnetization of the second free layer becomes substantially titled out-of-plane and the direction of magnetization of the first free layer switches. Upon electrical current being discontinued to the STTMRAM element, the direction of magnetization of the second free layer remains in a direction that is substantially opposite to that of the first free layer.

These and other objects and advantages of the present invention will no doubt become apparent to those skilled in the art after having read the following detailed description of the various embodiments illustrated in the several figures of the drawing.

IN THE DRAWINGS

Figure 6:
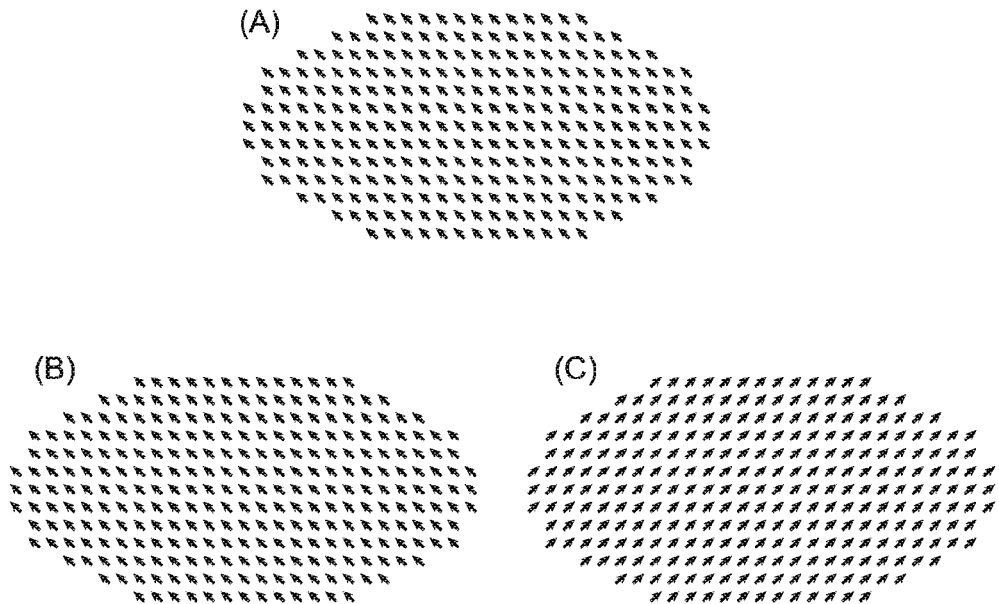

FIGS. 6(A) and 6(B) show the actual magnetizations of the free layers at 45 degree state point for S1 (prior art) and S2 (t1=t2=1.5 nm, d=0.5 nm), where S2 has 60% higher Hk value than S1.

FIG. 6(A) shows the magnetization state of S1 single layer at 45 degree state.

FIGS. 6(B) and 6(C) show the magnetization states of layers 24 and 28 at S2 tri-layer at 45 degree state.

Figure 7:
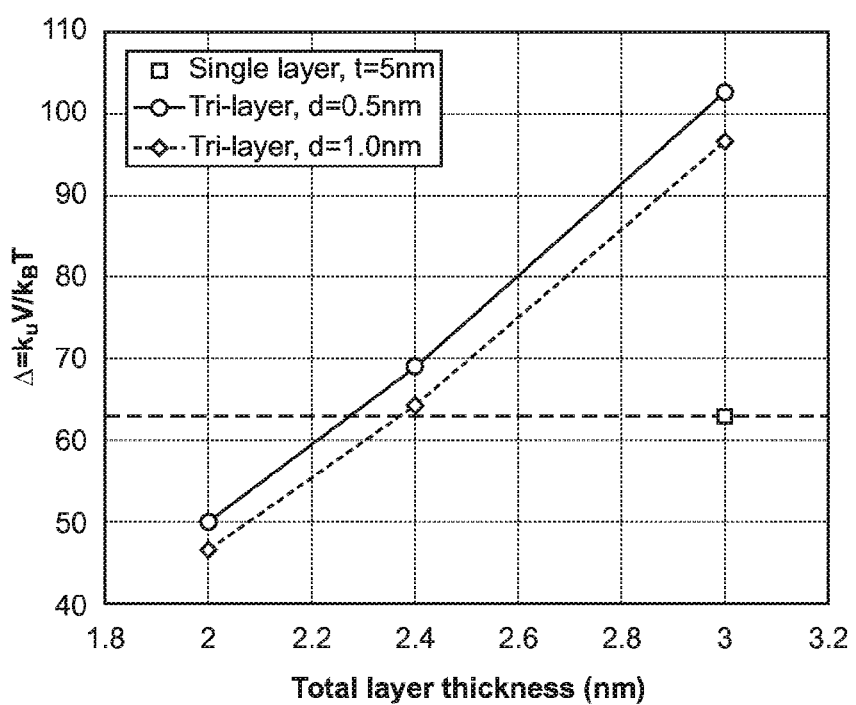

FIG. 7 shows the delta vs. total layer thickness for both the prior art single layer and current invention tri-layer designs.

Figure 8:
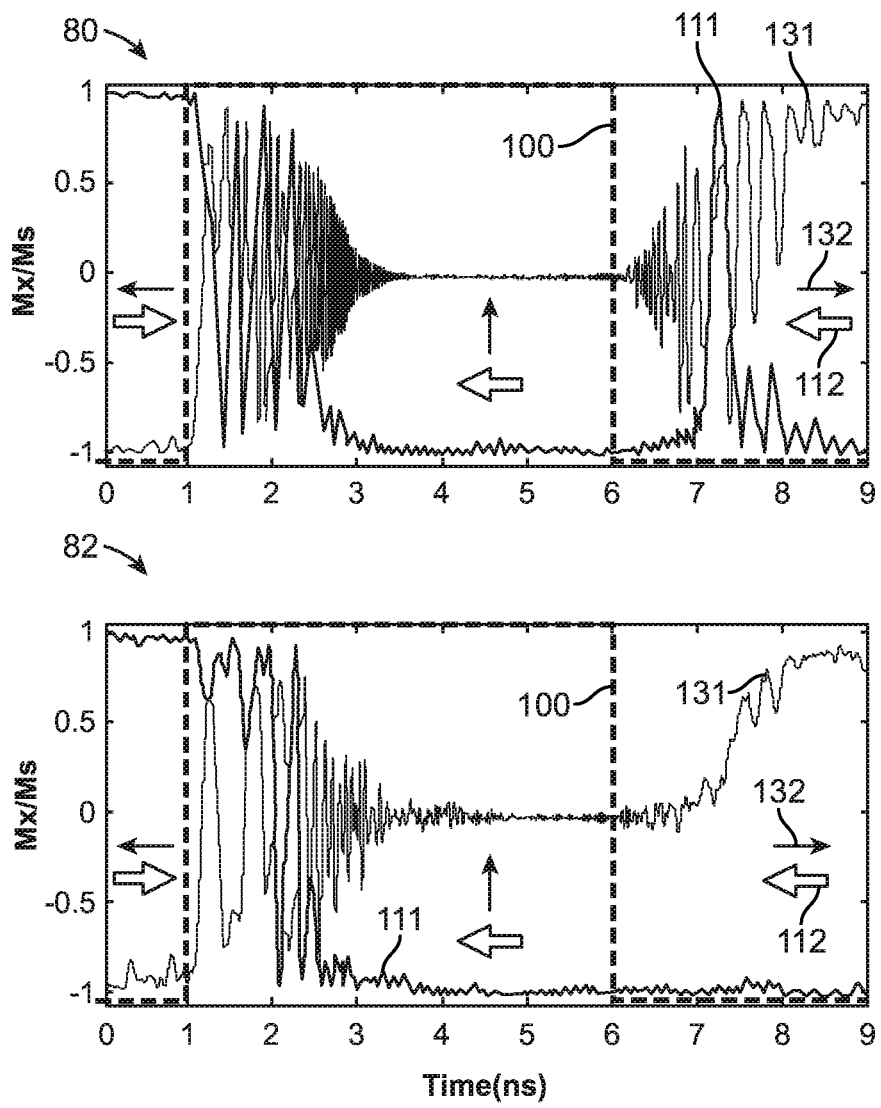

FIG. 8 shows two graphs, 80 and 82, comparing the switching stability of a STTMRAM element of the embodiments of the present invention that do not include the materials and thicknesses indicated of the FL 28 vs. the switching stability of the STTMRAM element of the embodiments of the present invention that do include the materials and thicknesses indicated herein of the FL 28.

Figure 9:
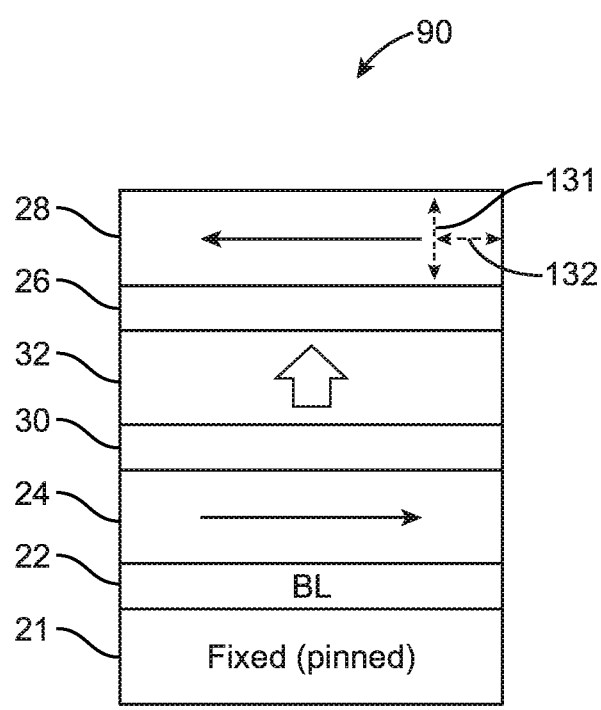

FIG. 9 shows a STTMRAM element 90, which essentially includes the layers of the element 20, in a different order, in accordance with another embodiment of the present invention.

Figure 10:
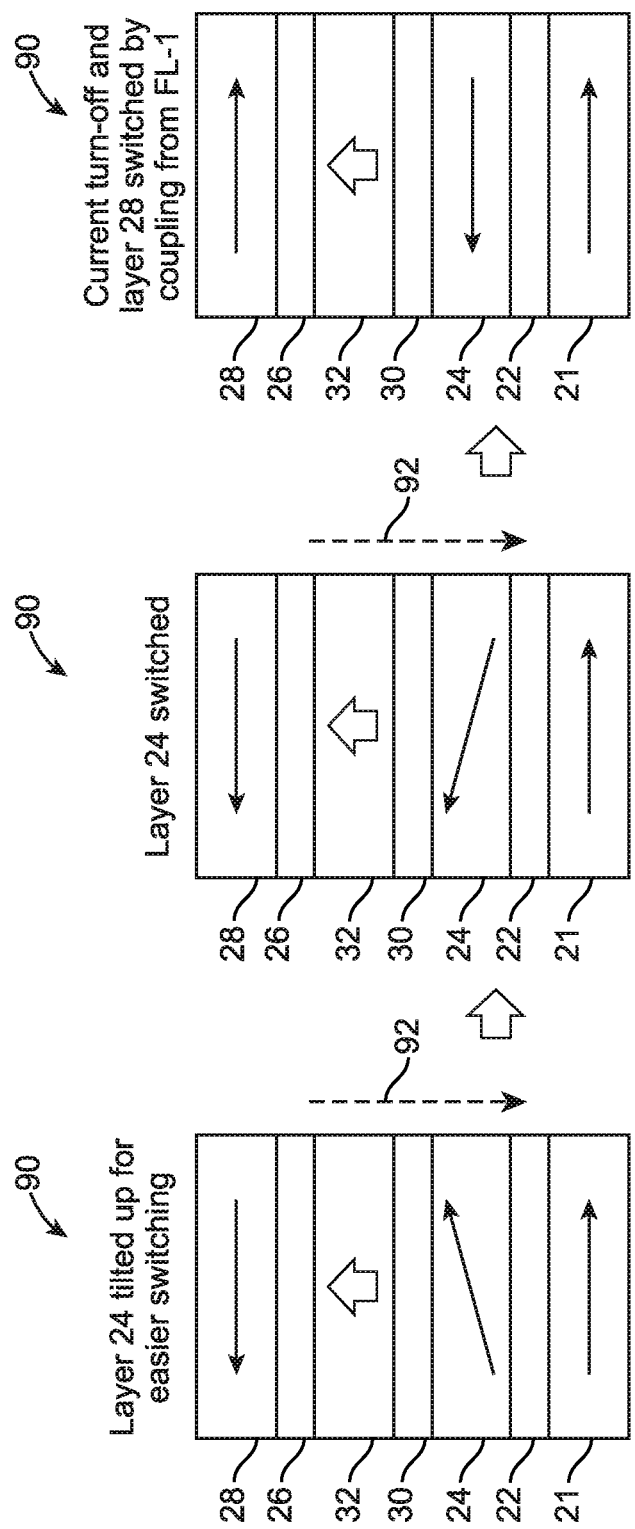
Figure 11:
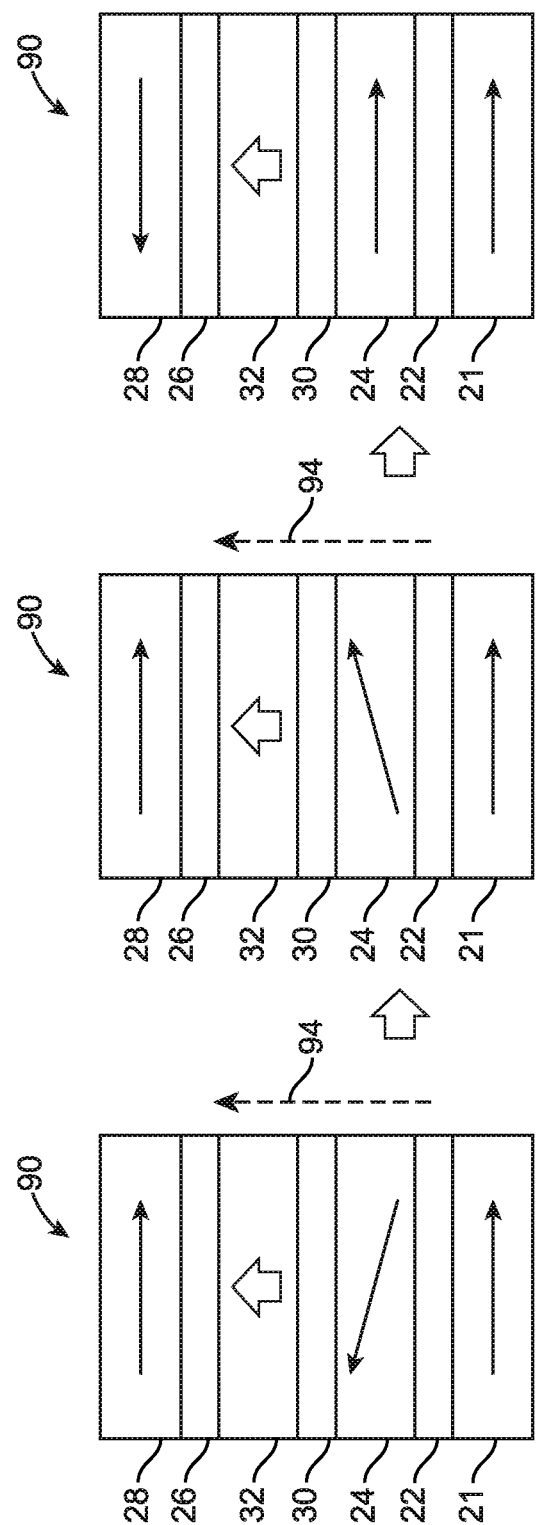

FIGS. 10-11 show the switching process exhibited by the element 90 of FIG. 9.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In the various STTMRAM elements to follow, a MTJ is employed with perpendicular magnetic anisotropy material (s) with improved stability in non-writing modes and easier switching during writing mode.

Figure 1:
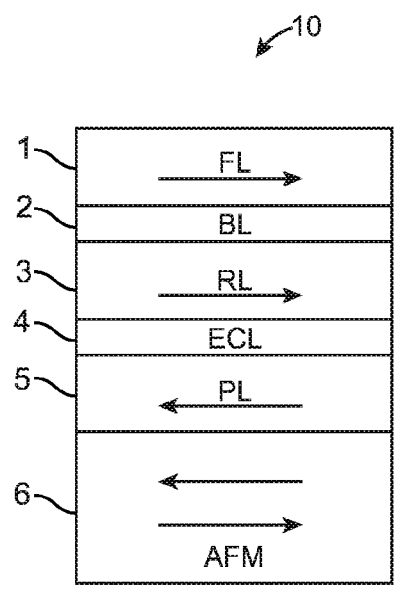
FIG. 1 shows a prior art STTMRAM element 10.
Figure 2:
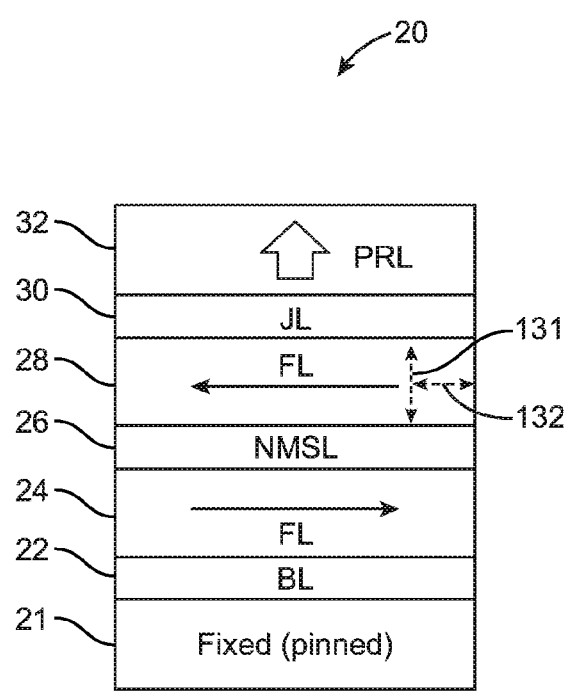
FIG. 2 shows relevant layers of a STTMRAM 20 in accordance with an embodiment of the present invention.

FIG. 2 shows relevant layers of a STTMRAM element 20 in accordance with an embodiment of the present invention. The STTMRAM element 20 is shown to include a fixed layer (sometimes referred to herein as a "reference layer (RL)") 21 on top of which is shown formed a barrier layer (sometimes referred to as a "tunneling layer") 22 on top of which is shown formed a free layer (FL) 24 on top of which is shown formed a non-magnetic separation layer (NMSL) 26 on top of which is shown formed a free layer 28 on top of which is shown formed a junction layer (JL) 30 on top of which is formed a perpendicular reference layer (PRL) 32. It is understood that the fixed layer 21 is generally formed on top of a substrate with intervening layers therebetween, such as a seed layer, a bottom electrode and other magnetic and non-magnetic layers. The NMSL 26 may be metal or non-metal but is a non-magnetic layer that prevents exchange coupling between its two adjacent layers, the FL 24 and the FL 28. The FL 24, NMSL 26 and FL 28 are collectively considered a free layer (or "magnetization layer") in some embodiments where the free layer is a multi-layered structure. In other embodiments, the free layer may include the same pattern of materials repeated numerous times. For example, the free layer may have a FL/NMSL/FL/NMSL/FL structure.

Arrows 131 and 132 show the direction of anisotropy in the FL 28, in various embodiments. For example, the arrow 131 shows the FL 28 to take on a perpendicular anisotropy and the arrow 132 shows the FL 28 to take on an in-place anisotropy relative to the plane of the film BL 22 is an insulation layer whose resistance changes when the relative magnetization orientations of its two adjacent layers, the FL 22 and the fixed layer 21, change.

In another embodiment, the JL 30 is another barrier layer and in some embodiments, it is made of aluminum (Al) oxide or manganese (Mg) oxide or a conductive layer with Giant Magnetoresistance (GMR) effect between FL 28 and PRL 32. Electrons flowing between FL 28 and the PRL 32 carry spin torque effect as well and will cause magnetic change on the FL 28 due to spin transfer effects from the PRL 32.

NMSL 26 mainly creates spatial separation between the FL 24 and the FL 28. No or very weak spin transfer effect between the FL 24 and the FL 28 exists through the NMSL 26.

At non-writing state or when the STTMRAM element 20 is not being written to, the magnetizations of the FL 24 and the FL 28 are anti-parallel and couple to each other through magneto-static coupling field from the edges of these two layers. This coupling enhances thermal stability during non-switching state and increases data retention capability. With additional in-plane anisotropy in the FL 28, the thermal stability of the tri-layer structure, FL 24/NMSL 26/FL 28, can be further enhanced. Such anisotropy is realized either from shape anisotropy or from crystalline anisotropy.

FL 28 can also have a certain perpendicular-to-film plane anisotropy so that when under perpendicular direction spin torque or external field magnetization can further rotate out of plane or even oscillation in-plane due to the perpendicular anisotropy axis.

Exemplary materials of which the various layers of the STTMRAM 20 can be made with various associated thicknesses and various characteristics are presented below:

PRL 32:
Characteristic: Intrinsic perpendicular anisotropy
Examplary materials in the case where PRL 32 is a single layer: iron platinum alloy FePtXY, where X and Y each represent a material with X being any of the following materials: boron (B), phosphorous (P), carbon (C), nitride (N) and Y being any of the materials: Cobolt (Co), tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf) and bismuth (Bi), molybdenum (Mo) or ruthenium (Ru).
Alternative Characteristic: Interfacial effect inducing perpendicular magnetic anisotropy
Examplary materials in the case where PRL 32 is made of alloys: Fe-rich FeCoXY or FeNiXY alloys, or alloys CoNiXY.
In the case where PRL 32 is made of multiple layers, exemplary materials are as follows:
[Co/Pt]n, [Co/Pd]n, [Co/Ni]n,
Amorphous ferrimagnetic alloys, such as TbFeCo, GdFeCo JL 30:
Non-magnetic metals copper (Cu), silver (Ag), gold (Au);
Non-magnetic materials, aluminum oxide (Al2O3), zinc oxide (ZnO), magnesium oxide (MgO)

FL 28:

The FL 28 may be made of alloys, such as FeCoXY, FeNiXY, or CoNiXY. The perpendicular anisotropy is tuned while keeping the equilibrium orientation in-plane.

An alloy of one or more of the following material may also comprise the FL 28: iron (Fe), nickel (Ni), cobalt (Co), platinum (Pt), copper (Cu), boron (B), tantalum (Ta), titanium (Ti), chromium (Cr), niobium (Nb), vanadium (V), zirconium (Zr), terbium (Tb), samarium (Sm), neodymium (Nd), and gadolinium (Gd). May also be comprised of one or more of silicon dioxide ($SiO_2$), titanium dioxide ($TiO_2$), tantalum oxide ($Ta_2O_5$), and aluminum oxide ($Al_2O_3$).

In other embodiment, the FL 28 is made of magnetic alloys, such as CoFeB-X, where 'X' is chosen from the elements having low emissivity into Co and/or Fe, by using one or more of the following elements: Cr, Cu, Ta, Ti, Mo, P, N, and O. 'X', in some embodiments, is less than 25 atomic percentage (at %) of Cr, Cu or Mo.

In yet another embodiment, FL 28 is made of CoFeB-Y, where 'Y' is chosen from one or more of the oxides and nitrides, such as, $SiO_2$, $TiO_2$, $Ta_2O_5$, WO, or $ZrO_2$. 'Y', in some embodiments, is less than 20 molar percentage of $SiO_2$ or $TiO_2$.

FL 24:

An alloy of one or more of iron (Fe), nickel (Ni), cobalt (Co), platinum (Pt), copper (Cu), boron (B), tantalum (Ta), titanium (Ti), chromium (Cr), niobium (Nb), vanadium (V), zirconium (Zr), terbium (Tb), samarium (Sm), neodymium (Nd), and gadolinium (Gd).

NMSL 26:

Non-magnetic materials, such as titanium dioxide ($TiO_2$), oxide ($Al_2O_3$), ruthenium oxide (RuO), strontium oxide (SrO), zinc oxide (ZnO), magnesium oxide (MgO), zirconium dioxide ($ZrO_2$), titanium (Ti), tantalum (Ta), ruthenium (Ru), magnesium (Mg), chromium (Cr), niobium (Nb), nickel niobium (NiNb).

Non-magnetic metals copper (Cu), silver (Ag), gold (Au).

Alternatively, 'n' number of interlaced non-magnetic oxide and non-magnetic metallic layers may comprise NMSL 26, 'n' being an integer equal or greater than one.

In yet another embodiment, a thin layer, of less than 10 nano meters (nm) in thickness, of Cr, Cu, CrTa, CrTi, CrMo, CrTib, CrZrB, or CrW is deposited on top of the FL 28 prior to deposition of the JL 30. During manufacturing of the element 20, and specifically the magnetic annealing process, the foregoing elements segregate along the grain-boundaries and/or along the defect areas to decouple the magnetic grains of the FL 28.

In still another embodiment, a thin layer, typically less than 10 nm, of Cr, Cu, CrTa, CrTi, CrMo, CrTiB, CrZrB, CrW is deposited in the middle of the FL 28, during manufacturing of the element 20.

In a yet another embodiment, right after deposition of the FL 28, and before deposition of the JL 30, an ion implantation process is carried out whereby ions of Cr, Mo, Ta, Ti, Zr, are implanted into the FL 28.

In yet another embodiment, a reactive gas is introduced during the deposition of FL 28. The gas can be chosen from one or more of the following: $O_2$, $N_2$, Co, $Co_2$, No, $NO_2$, $SO_2$, $CF_4$, or $CL_2$. The flow rate of the inert gas can be kept constant or changed during deposition of the FL 28.

The foregoing approaches and structures desirably result in the formation of largely magnetic and non-magnetic areas in the FL 28 thereby lowering the stiffness of the element 20. In fact, FIG. 8 shows graphs showing the affect of the foregoing methods and structure on the behavior of the element 20, as will be discussed shortly below.

It is understood that in various embodiments, any combination of the above-noted material may be employed.

Figure 3A:
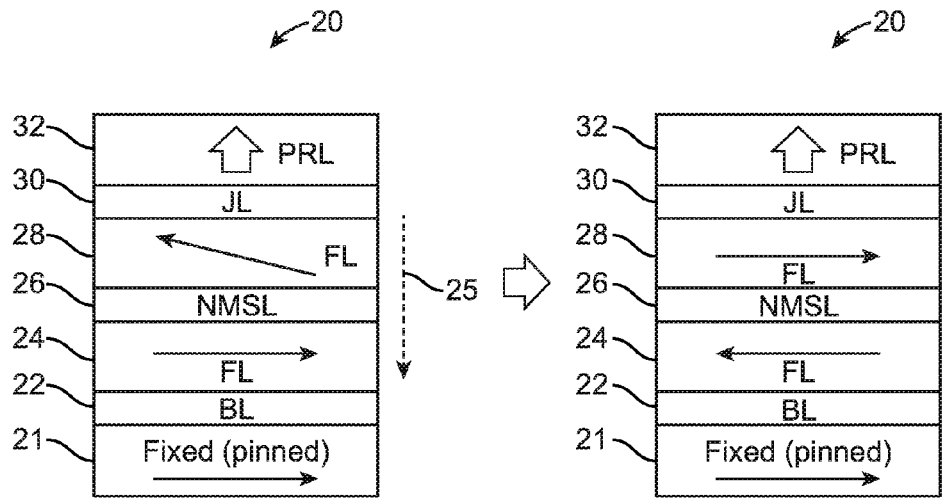
FIG. 3(A) shows the state of the element 20 changing from a parallel magnetic orientation to an anti-parallel magnetic orientation.
Figure 3B:
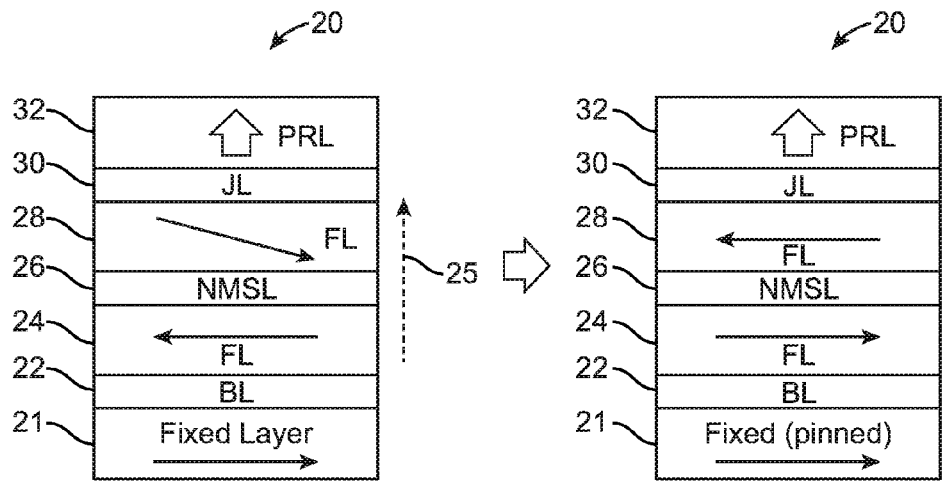
FIG. 3(B) shows the state of the element 20 changing from an anti-parallel magnetic orientation to a parallel magnetic orientation.

FIG. 3(A) shows the state of the element 20 changing from a parallel magnetic orientation to an anti-parallel magnetic orientation. That is, the direction of magnetization of the FL 24 change relative to the RL 21. FIG. 3(B) shows the state of the element 20 changing from an anti-parallel magnetic orientation to a parallel magnetic orientation. That is, the direction of magnetization of the FL 24 relative to the RL 21.

In FIG. 3(A), at the left side of the figure, the element 20 is shown with electrons flowing, as indicated by the arrow 25, from FL 28 to the direction of BL 22. These electrons first flow through PRL 32 and then into FL 28. Due to these transmitted electrons' spin torque (ST) effect between the PRL 32 and the FL 28 through the JL 30, FL 28's magnetization is further rotated out of plane towards the magnetization direction of PRL 32, and can be substantially perpendicular when spin torque is strong enough to allow such perpendicular configuration. With less in-plane magnetization of FL 28, FL 24 experiences less coupling field from FL 28 and coupling-induced-stabilization of FL 24 by FL 28 is reduced. Thus, FL 28-to-FL 24 magnetic latching mechanism is released. Magnetic latching (or "latching" as used herein) refers to the process of weaker coupling of the FL 28 to FL 24 allowing easier switching of the FL 24. Releasing the latching (or "unlatching" as used herein) refers to the FL 28 coupling to FL 24 to be released. With electrons continuing to travel from FL 24 to RL 21 through BL 22, reflected electrons from RL 21 lead to switching of FL 24 to an anti-parallel state while FL 28-FL 24 coupling is unlatched.

When FL 24 completes its state switching, electrical current is discontinued. Spin torque from PRL 32 to FL 28 now also discontinues. FL 28's magnetization rotates back to an in-plane orientation, as shown by the state of the element 20 on the right side of FIG. 3(A). Due to magneto-static field from FL 24, when magnetization of the FL 28 rotates back in-plane, the magnetization of the FL 28 orients anti-parallel relative to that of FL 24, which is once again in a latched magnetization configuration.

In summary, prior to the flow of electrical current through the element 20, the direction of magnetization of each of the FLs 24 and 28 is substantially in-plane and after the application of electrical current to the element 20, with the electrical current flowing through each of the layers thereof, the direction of magnetization of the FL 28 becomes titled out-of-plane, either completely or partially, and the direction of magnetization of the FL 24 switches. When the application of electrical current to the element 20 is discontinued, the direction of magnetization of the FL 28 remains in a direction that is substantially opposite to that of the FL 24.

It is noted that electrical current is applied either from the bottom to the top of the element 20 or from the top to the bottom of the element 20.

With reference to FIG. 3(B), switching of FL 24 from anti-parallel to parallel orientation relative to RL 21 is now explained. An analogous operation takes place in FIG. 3(B) as that explained relative to FIG. 3(A), except that electrons move in the opposite direction, as indicated by the arrow 25 in FIG. 3(B). Thus, FL 28 experiences reflected electrons from PRL 32 when current is applied and rotates out of plane opposite to that magnetization of the PRL 32. FL 28-to-FL 24 coupling is thus unlatched. FL 24 switches its state to a parallel state relative to RL 21 magnetization due to transmitted electrons from RL 21. Once switching is completed and current is removed, FL 28s magnetization rotates to an in-plane and anti-parallel to the magnetization of FL 24 due to the magneto-static coupling field from FL 24.

Figure 4A:
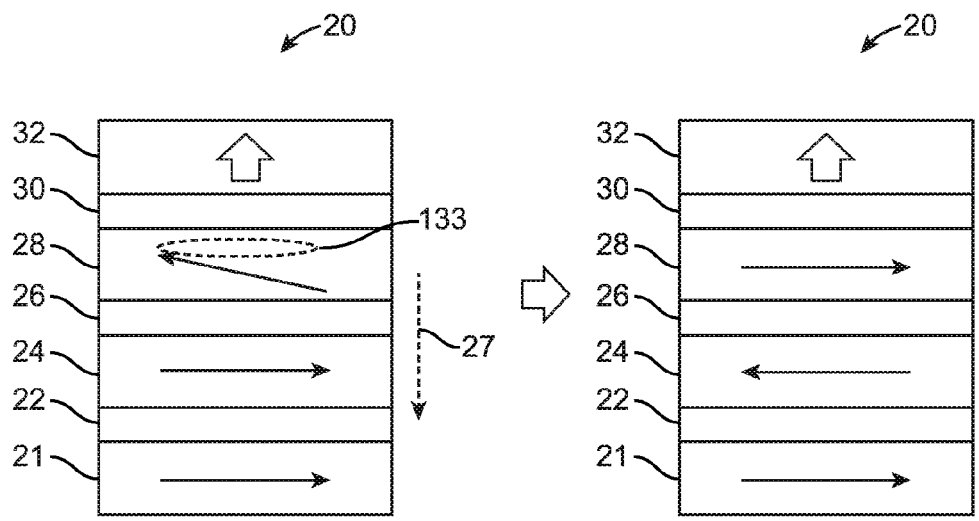
FIG. 4(A) shows the state of the element 20 during the witching of the FL 24 from a parallel to an anti-parallel orientation relative to the RL 21.
Figure 4B:
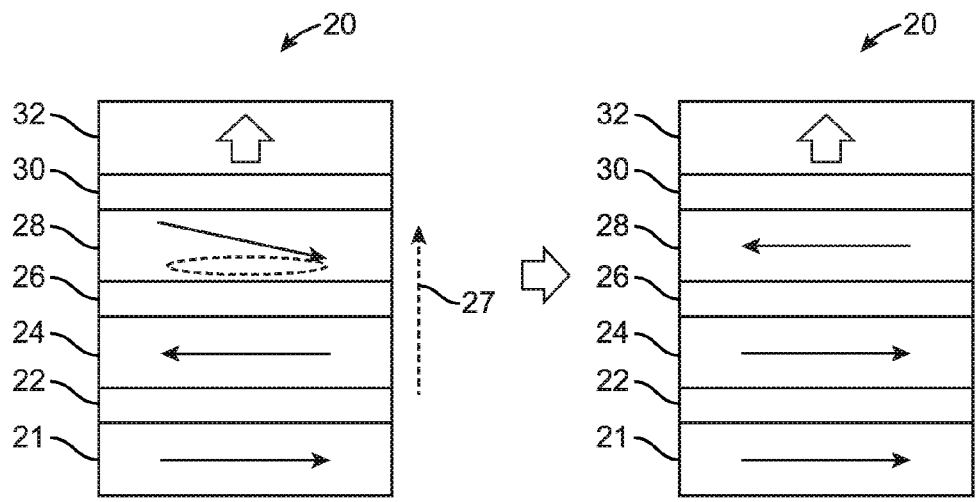
FIG. 4(B) shows the state of the element 20 during the switching of the FL 24 from an anti-parallel to a parallel orientation relative to the RL 21.

FIG. 4(A) shows the state of the element 20 during the switching of the FL 24 from a parallel to an anti-parallel orientation relative to the RL 21. The arrow 27 shows the direction of electrons as the arrow 25 in FIG. 3(A). FIG. 4(B) shows the state of the element 20 during the switching of the FL 24 from an anti-parallel to a parallel orientation relative to the RL 21. The arrow 27 shows the direction of electrons as the arrow 27 in FIG. 3(B).

The switching process is analogous to that which is described above relative to FIGS. 3(A) and 3(B), except that during current application, FL 28 does not just rotate out of plane. Due to the existence of surface demagnetization field of FL 28, with possibly a relatively strong perpendicular anisotropy 131 in FL 28, FL 28 in-plane magnetization component starts to oscillate in-plane and forms a ferromagnetic-resonance (FMR) mode, with a magnetization trajectory depicted as 133, at the left side of FIG. 4(A). Such oscillation can be much higher frequency than the switching speed of the FL 24 and thus produces effectively zero field in the FL 24 from FL 28 over the switching process of the FL 24. Alternatively, magnetization of FL 28 can become completely perpendicular after the initial oscillation state. After FL 24 switching and current is removed, FL 28 magnetization relaxes back to in-plane orientation anti-parallel to that of the FL 24 due to magneto-static coupling field from FL 24.

In FIG. 4(B), the operation of the element 20 is analogous to that of FIG. 4(A) discussed above except that the direction of the travel of electrons is in the opposite direction. Thus, FL 28 experiences reflected electrons from the PRL 32 when current is applied and rotates out of plane opposite to the magnetization of the PRL 32 and starts ferromagnetic-resonance (FMR) oscillation. FL 28-to-FL 24 coupling is thus unlatched. Alternatively, magnetization of the FL 28 can become completely perpendicular after the initial oscillation state. FL 24 switches to a state that is parallel to that of the FL 21 due to transmitted electrons from FL 21. Once switching is complete and current is removed, FL 28 magnetization rotates back in-plane and anti-parallel to that of FL 24 due to the FL 24's magneto-static coupling field.

Accordingly, the various embodiments of the present invention realize greater stability than that realized currently by prior art techniques and as discussed hereinabove, use a tri-layer structure, layers 24-28, where FLs 24 and 28, separated by the NMSL 26, magneto-statically couple to each other through edge magnetic charges in quiescent state. Such coupling makes the tri-layer structure stable against thermal agitation. Meanwhile, it allows for thinner than usual magnetic layers FL 24 and FL 28 due to stronger thermal stability. In one embodiment of the present invention, the combined thickness of FL 24 and FL 28 is 20% thinner than a single free layer of prior art techniques, at the same thermal stability.

Additionally, with magnetic latching FL 28 mainly affected by spin torque from PRL 32, which is perpendicular in its magnetic state, while coupling between layers FL 24 and FL 28 is affected by NMSL 26's thickness, thermal stability through latching effect and easiness of switching with temporarily turning off the latching by spin torque from the PRL 32 to the FL 28 can be individually adjusted with much larger space of optimization than the prior art, where thermal stability and easiness of switching are tightly bonded due to utilizing a single layer FM2 for the switching and data storage.

Figure 5:
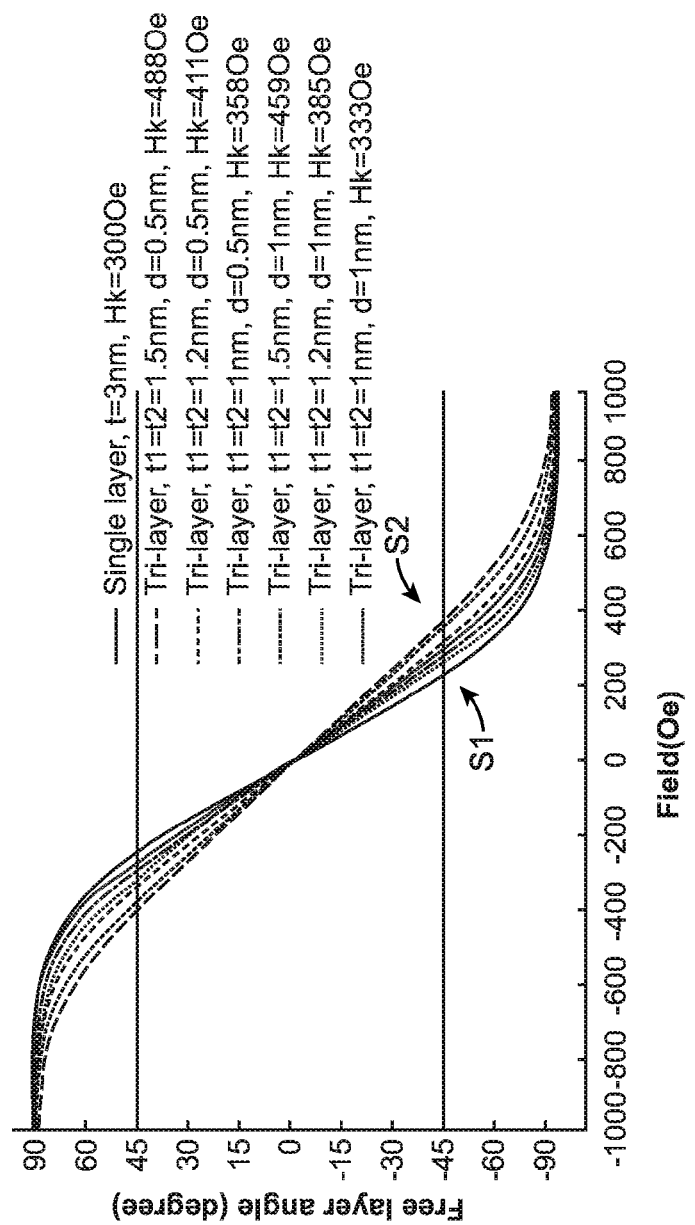
FIG. 5 shows the simulated hard axis transfer curves of a prior art STTMRAM element and a STTMRAM element of the various embodiments of the present invention, such as the element 20.

FIG. 5 shows the simulated hard axis transfer curves of a prior art STTMRAM element with a single free layer (switching layer) and a STTMRAM element of the various embodiments of the present invention, such as the element 20. An external field is applied to the STTMRAM element structure, where a same size elliptical shape with aspect ratio ~2 and long axis <200 nm is assumed for all STTMRAM element structures. The single layer case as in FIG. 5 is for the prior art structures with a single switching layer, i.e. layer 1 in prior art-1 and FM2 layer in prior art-2. Tri-layer cases consider a switching layer structure composed of layers 24~28 as in the embodiments. For the prior art single layer case, the switching layer Ms=1000 emu/cc with thickness t=3 nm. For the embodiment tri-layer cases, layer 24 and 28 have Ms=1000 emu/cc, with thickness t1(layer 24)=t2(layer 28) and varying from 1 nm to 1.5 nm. The thickness of the spacer layer 26 varies between 0.5 nm and 1 nm in some embodiments. The graph of FIG. 5 shows external field, in the x-axis, vs. the angle of magnetization of the free layer of the various embodiments of the present invention, in the y-axis. An external field of −1 kOe to +1 kOe is applied in the short axis direction of the ellipse. The free layer magnetization angle relative to the long axis direction of the ellipse is plotted vs. the applied field in FIG. 5. At angle of 45 degree, it is regarded the point where the applied field equals intrinsic Hk of the STTMRAM free layer.

From FIG. 5, it is clearly shown that with tri-layer structure, the field required to reach 45 degree angle is higher than the single layer case. The corresponding Hk values estimated from the transfer curves for each case is also indicated in the legend of FIG. 5. By varying the magnetic layer thickness and spacer layer thickness of the tri-layer structure, Hk changes accordingly due to varied coupling strength. However, all cases show a stronger Hk, than single 3 nm layer case as in prior arts, indicating a better thermal stability of the tri-layer structure.

FIGS. 6(A) and 6(B) show the actual magnetizations of the free layers at 45 degree state point for S1 (prior art) and S2 (t1=t2=1.5 nm, d=0.5 nm), where S2 has 60% higher Hk value than S1.

In particular, FIG. 6(A) is the magnetization state of S1 single layer at 45 degree state. FIGS. 6(B) and 6(C) are the magnetization states of layers 24 and 28 at S2 tri-layer at 45 degree state. FIG. 6(A) and FIG. 6(B) are quite similar, only that FIG. 6(B) happens at a much higher field.

FIG. 7 shows the delta (a measurement of thermal stability) vs. total layer thickness for both the prior art single layer and current invention tri-layer designs. The delta value is defined as magnetic anisotropy energy of the magnetic layer divided by the thermal excitation energy, i.e. $K_u V/k_B T = H_k M_s V/2k_B T$, where Hk values are previously obtained from FIG. 5, $M_s$=1000 emu/cc for all structures, $k_B$ is Boltzmann constant, T is the absolute temperature of 80 degree Celsius. V for prior art design is the volume of the single switching layer, and the combined volume of layers 24 and 28 in the embodiments of the present invention. FIG. 7 shows the delta vs. total layer thickness for tri-layer structures with spacer layer thickness of 0.5 nano meters (nm) and 1 nm. For prior art, only t=3 nm is considered as reference. From FIG. 7, it is clearly shown that delta for tri-layer design at same total magnetic layer thickness is much higher than prior art single layer. Also to reach same as prior art delta, tri-layer thickness can be <2.4 nm, which is more than 20% thinner than prior art. During switching by spin torque, embodiment type of operation unlatches layer 28 from coupling to layer 24, and makes switching volume even smaller than the combined volume. Thus a higher stability and easier to switching MRAM MTJ is achieved.

FIG. 8 shows two graphs, 80 and 82, comparing the switching stability of a STTMRAM element of the embodiments of the present invention that do not include the materials and thicknesses indicated of the FL 28 vs. the switching stability of the STTMRAM element of the embodiments of the present invention that do include the materials and thicknesses indicated herein of the FL 28. Each graph has y-axis representing Mx/Ms (switching stabilization) with 'Mx' representing the magnetization of the free layer in the easy axis, i.e. long axis, and 'Ms' representing the saturation magnetization of the free layer and x-axis representing time in nano seconds. Graph 80 is the performance of the STTMRAM element 20 without the materials and thicknesses noted in the various embodiments discussed hereinabove at pages 9-12 hereinabove whereas graph 82 is the performance of the STTMRAM element 20 using the materials and thicknesses noted in the various embodiments discussed hereinabove at pages 9-12 hereinabove. The line 131 is the switching behavior of the FL 28 in real-time and when FL 28 has an in-plane magnetization, as does the line 111 relative to another switching state of the FL 28. Line 132 is the orientation of the FL 28 during switching, as is line 112 when another switching state takes place. Line 100 is a 5 ns pulse starting from 1 ns and ending at 6 ns, applied to the element 20. As shown, switching of the FL 28, in graph 82, is far smoother, with less volatility, than that shown in graph 80. Switching stabilization improvement desirably causes reduced internal exchange in the FL 28. It is noted that in graph 80, the FL 28's internal exchange is approximately $1 \times 10^{-6}$ erg/cm whereas in graph 82, the internal exchange of the FL 28 is $0.2 \times 10^{-6}$ erg/cm. Accordingly, the graphs of FIG. 8 show reducing the internal exchange of the FL 28, and applying a current pulse that ends at 6 ns, the FL 24 and the FL 28, having an in-plane magnetization oscillation, effectively eliminate and render final switched state of the FL 24 and the FL 28 more stable and repeatable.

FIG. 9 shows a STTMRAM element 90, which essentially includes the layers of the element 20, in a different order, in accordance with another embodiment of the present invention. In FIG. 9, the element 90 is shown to have the fixed layer 21, which is formed on a substrate (not shown) and on top of the layer 21, is shown formed the BL 22 on top of which is shown formed the FL 24, on top of which is shown formed the PRL 32, on top of which is shown formed JL 32, on top of which is shown formed NMSL 26 and on top of which is shown formed FL 28. While the direction of the arrows in FIG. 9 show an in-plane magnetization of the element 90, a perpendicular magnetization is contemplated, as shown by the lines 131 and 132 of FIG. 8, in the FL 28.

During operation, when current is applied to the element 90, spin transfer torque from the PRL 32 rotates the FL 24 magnetization partially out of plane. With reduced in-plane magnetic moment of the FL 24, in-plane shape anisotropy of FL 24 reduces and its in-plane switching by the spin transfer torque from fixed layer 21 becomes easier. Once FL 24 is switched and current turned off, FL 24 out of plane magnetization falls back in-plane and magnetizes FL 28 to rotate to opposite direction relative to the FL 24 in-plane magnetization due to the magnetic field from FL 24 acting on FL 28.

FIGS. 10-11 show the switching process exhibited by the element 90 of FIG. 9. FIG. 10 shows the element 90 with the direction of magnetization of the layers 21, 24, 32 and 28, as shown by the respective arrows in each layer. The direction of magnetization of the FL 24 is tilted up, for easier switching, and titled up in a direction to pointing to the right of the page. When current 92 is applied to the element 90, in the direction shown, going from FL 28 down to the layer 21, the FL 24 switches magnetization direction to point to the left but it still remains tilted, shown at element 90 in the middle of FIG. 10. However, the direction of magnetization of the FL 28 remains the same. Next, when current 92 is turned off and no longer applied to the element 90, as shown by the element 92 appearing at the right-most of FIG. 10, the FL 28 switches magnetization direction due to its coupling with the FL 24. Compared to the MRAM structure without the PRL and JL, the requisite switching voltage, in the embodiment of FIG. 9, is lowered by 20%-50%.

FIG. 11 shows the switching process exhibited by the element 90 of FIG. 9 but in a direction that is opposite to that of the FIG. 10. In FIG. 11, current 94 is shown to be applied in a direction, indicated by the arrow associated with the current 94, going from the layer 21 to the FL 28. The FL 28 of the element 90 is initially shown to have a magnetization direction that is opposite to the initial magnetization direction of the FL 28 of FIG. 10. The same holds true for the magnetization direction of the FL 24 of FIG. 11 in association with its counterpart in FIG. 10 with the FL 24 having a tilted-left direction of magnetization initially. When current 94 is applied, first, as in FIG. 10, the direction of magnetization of the FL 24 switches but the direction of magnetization of the FL 28 remains the same, as shown at the element 90 in the middle of the FIG. 11. Subsequently, when current 94 is no longer applied to the element 90, as shown at the left-most of the FIG. 11, the direction of magnetization of the FL 28 switches.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A spin-transfer torque magnetic random access memory (STTMRAM) element configured to store a state when electrical current is applied thereto, the STTMRAM element comprising:
    a) a fixed layer with magnetization pinned in the plane of the fixed layer;
    b) a barrier layer formed on top of the fixed layer;
    c) a junction layer (JL);
    d) a magnetization layer disposed between the barrier layer and the JL, the magnetization layer comprising a first free layer and a second free layer, separated by a non-magnetic separation layer (NMSL), the first and second free layers each having in-plane magnetizations that are antiparallel relative to each other and act on each other through magneto-static field;
    e) a perpendicular reference layer (PRL) formed on top of the JL with magnetization in a direction perpendicular to the magnetization of the fixed layer, the direction of the magnetization of the first and second free layers each being in-plane prior to the application of electrical current and after the application of electrical current to the STTMRAM element, the direction of magnetization of the second free layer becoming tilted out-of-plane and the direction of magnetization of the first free layer switches in-plane and upon electrical current no longer flowing through the STTMRAM element, the direction of magnetization of the second free layer returning to an in-plane direction that is substantially opposite to that of the first free layer.

2. The STTMRAM element, as recited in claim 1, wherein the second free layer is made of cobolt-iron-boron-X (CoFeB-X), where 'X' is chosen from among a group of elements having low emissivity into Co and/or Fe, by using one or more of the following elements: Cr, Cu, Ta, Ti, Mo, P, N, and O.

3. The STTMRAM element, as recited in claim 2, the second free layer is made of cobalt-iron-boron-X (CoFeB-X), wherein 'X' is less than 25 atomic percentage (at %) of Cr, Cu or Mo.

4. The STTMRAM element, as recited in claim 1, wherein the second free layer is made of cobalt-iron-boron-Y (CoFeB—Y), where 'Y' is chosen from one or more of the oxides and nitrides, such as, $SiO_2$, $TiO_2$, $Ta_2O_5$, WO, or $ZrO_2$.

5. The STTMRAM element, as recited in claim 4, wherein 'Y' is less than 20 molar percentage of $SiO_2$ or $TiO_2$.

6. The STTMRAM element, as recited in claim 1, wherein the PRL is pinned through internal crystalline anisotropy.

7. The STTMRAM element, as recited in claim 1, wherein the PRL is pinned through surface anisotropy arising from the interface of a magnetic and a nonmagnetic material.

8. The STTMRAM element, as recited in claim 1, wherein the NMSL is an oxide composed of one or more of the materials selected from a group consisting of: Mg, Al, B, Zn, O, N, Fe, Co, and Si.

9. The STTMRAM element, as recited in claim 1, wherein the NMSL is made of non-magnetic material.

10. The STTMRAM element, as recited in claim 1, wherein the NMSL is made of a material selected from a group consisting of:
   titanium dioxide ($TiO_2$), aluminum oxide ($Al_2O_3$), ruthenium oxide (RuO), strontium oxide (SrO), zinc oxide (ZnO), magnesium oxide (MgO), zirconium dioxide ($ZrO_2$), titanium (Ti), tantalum (Ta), ruthenium (Ru), magnesium (Mg), chromium (Cr), niobium (Nb), and nickel niobium (NiNb).

11. The STTMRAM element, as recited in claim 1, wherein the NMSL is made of 'n' number of interlaced non-magnetic oxide and non-magnetic metallic layers, with 'n' being an integer equal or greater than one.

12. The STTMRAM element, as recited in claim 1, wherein the JL is made of a material selected from a group of non-magnetic metals consisting of: copper (Cu), silver (Ag), and gold (Au).

13. The STTMRAM element, as recited in claim 1, wherein the JL is made of a material selected from a group of non-magnetic materials consisting of: aluminum oxide ($Al_2O_3$), zinc oxide (ZnO), and magnesium oxide (MgO).

14. The STTMRAM element, as recited in claim 1, wherein the PRL is made of an iron platinum alloy (FePtXY), where X and Y each represent a material and X is a material selected from a group consisting of:
   boron (B), phosphorous (P), carbon (C), nitride (N) and Y being any of the materials: Cobolt (Co), tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf) and bismuth (Bi), molybdenum (Mo), and ruthenium (Ru).

15. The STTMRAM element, as recited in claim 1, wherein the PRL is made of multiple layers and materials selected from one or more of a group consisting of: [Co/Pt]n, [Co/Pd]n, and [Co/Ni]n.

16. The STTMRAM element, as recited in claim 1, wherein the PRL is made of amorphous ferrimagnetic alloys, TbFeCo or GdFeCo.

17. The STTMRAM element, as recited in claim 1, wherein the second free layer is made of a material selected from a group consisting of: iron (Fe), nickel (Ni), cobalt (Co), platinum (Pt), copper (Cu), boron (B), tantalum (Ta), titanium (Ti), chromium (Cr), niobium (Nb), vanadium (V), zirconium (Zr), terbium (Tb), samarium (Sm), neodymium (Nd), and gadolinium (Gd).

18. The STTMRAM element, as recited in claim 1, wherein the second free layer is made of one or more materials selected from a group consisting of: silicon dioxide ($SiO_2$), titanium dioxide ($TiO_2$), tantalum oxide ($Ta_2O_5$), and aluminum oxide ($Al_2O_3$).

19. The STTMRAM element, as recited in claim 1, wherein the second free layer is made of one or more magnetic alloys selected from a group consisting of:
   CoFeB-X, where 'X' is chosen from the elements having low emissivity into Co and/or Fe, by using one or more of the following elements: Cr, Cu, Ta, Ti, Mo, P, N, and O.

20. The STTMRAM element, as recited in claim 19, wherein 'X' is less than 25 atomic percentage (at %) of Cr, Cu or Mo.

21. The STTMRAM element, as recited in claim 1, wherein the second free layer is made of CoFeB-Y, where 'Y' is chosen from one or more oxides and nitrides, selected from a group consisting of: $SiO_2$, $TiO_2$, $Ta_2O_5$, WO, and $ZrO_2$.

22. The STTMRAM element, as recited in claim 21, wherein 'Y' is less than 20 molar percentage of $SiO_2$ or $TiO_2$.

23. The STTMRAM element, as recited in claim 1, wherein the first free layer is made of an alloy made of one or more materials selected from a group consisting of: iron (Fe), nickel (Ni), cobalt (Co), platinum (Pt), copper (Cu), boron (B), tantalum (Ta), titanium (Ti), chromium (Cr), niobium (Nb), vanadium (V), zirconium (Zr), terbium (Tb), samarium (Sm), neodymium (Nd), and gadolinium (Gd).

24. The STTMRAM element, as recited in claim 1, wherein the second free layer is completed tilted after the application of the electrical current.

25. The STTMRAM element, as recited in claim 1, wherein the second free layer is partially tilted after the application of the electrical current.

26. The STTMRAM element, as recited in claim 1, wherein the first free layer is formed on top of the barrier layer and the NMSL is formed on top of the first free layer and the second free layer is formed on top of the NMSL and the JL is formed on top of the second free layer.

27. A method of storing a state in a spin-transfer torque magnetic random access memory (STTMRAM) element when electrical current is applied thereto comprising:
   a) prior to applying an electrical current to the STTMRAM element that is made of:
      a fixed layer having a magnetization that is pinned in the plane of the fixed layer,
      a barrier layer,
      a junction layer (JL), a magnetization layer disposed between the barrier layer and the JL, the magnetization layer comprising a first free layer and a second free layer, separated by a non-magnetic separation layer (NMSL), the made of non-magnetic material,
      a perpendicular reference layer (PRL) formed on top of the JL with magnetization in a direction perpendicular to the magnetization of the fixed layer, the direction of the magnetization of the first and second free layers each being in-plane and are antiparallel relative to each other
   b) applying an electrical current to the STTMRAM element causing tilting of the direction of magnetization of the second free layer to be out-of-plane and switching of the direction of magnetization of the first free layer in-plane; and c) discontinuing the application of electrical current to the STTMRAM element causing the direction of magnetization of the second free layer to return in an in-plane direction that is substantially opposite to that of the first free layer.

* * * * *